(12) United States Patent
Hao

(10) Patent No.: US 7,897,471 B2
(45) Date of Patent: Mar. 1, 2011

(54) METHOD AND APPARATUS TO IMPROVE THE RELIABILITY OF THE BREAKDOWN VOLTAGE IN HIGH VOLTAGE DEVICES

(75) Inventor: Jifa Hao, Scarborough, ME (US)

(73) Assignee: Fairchild Semiconductor Corporation, South Portland, ME (US)

(*) Notice: Subject to any disclaimer, the term of this patent is extended or adjusted under 35 U.S.C. 154(b) by 109 days.

(21) Appl. No.: 12/142,270

(22) Filed: Jun. 19, 2008

(65) Prior Publication Data
US 2009/0315155 A1 Dec. 24, 2009

(51) Int. Cl.
*H01L 21/336* (2006.01)

(52) U.S. Cl. ......... 438/288; 438/544; 438/640; 438/646; 257/E21.053; 257/E21.56; 257/E21.288; 257/E21.293; 257/E21.316; 257/E21.325

(58) Field of Classification Search .................. 257/288, 257/104, 367, 544, 639, 640, 646, 649, 279, 257/E21.17, 293, 53, 56, 562, 325, 316
See application file for complete search history.

(56) References Cited

U.S. PATENT DOCUMENTS

| 4,602,266 | A |   | 7/1986  | Coe |  |
|-----------|---|---|---------|-----|--|
| 4,776,896 | A |   | 10/1988 | Umemoto |  |
| 5,017,976 | A | * | 5/1991  | Sugita | ............................ 257/494 |
| 5,075,739 | A | * | 12/1991 | Davies | ............................ 257/170 |
| 5,107,323 | A |   | 4/1992  | Knolle et al. |  |
| 5,374,843 | A |   | 12/1994 | Williams et al. |  |
| 5,654,206 | A |   | 8/1997  | Merrill |  |
| 5,777,373 | A |   | 7/1998  | Groenig |  |
| 6,277,695 | B1 | * | 8/2001 | Williams et al. | ............... 438/268 |
| 6,445,054 | B1 |   | 9/2002 | Traijkovic et al. |  |
| 6,558,983 | B2 |   | 5/2003 | Saitou et al. |  |
| 6,770,917 | B2 | * | 8/2004 | Barthelmess et al. | ......... 257/104 |

OTHER PUBLICATIONS

Kuendig, J., et al., "Thin-Film Silicon Solar Cells for Space Applications: Radiation Hardness and Applications for an Integrated Solant (Solar Cell-Antenna) Module", 2000 IEEE, 0-7803-5772-8/00, pp. 1079-1082.
Osenbach, John W., "Semi-Insulating Silicon Nitride (SinSiN) as a Resistive Field Shield", 1990 IEEE, #0018-9383/90/0600-1522, vol. 37, No. 6, Jun. 1990, pp. 1522-1528.OHN.
Khan, M. Kamal, Ph. D., Rel. Engineering Dept. and Hao, Jifa, Ph. D., Process Engineering Dept., Harris Semiconductor Corporation, Mountain Top, PA 18707, "The Influence of Field Oxide Charge on the Reliability of Power Devices", total 7 pages.
Yilmaz, Hamza, Senior Member, IEEE, "Optimization and Surface Charge Sensitivity of High-Voltage Blocking Structures with Shallow Junctions", 1991 IEEE Transactions on Electron Devices, vol. 38, No. 7, Jul. 1991, pp. 1666-1675.
Matsushita, T., et al., "Highly Reliable High-Voltage Transistors by use of the Sipos Process", Sony Corporation, Atsugi Plant 4-14-1 Asahi, Atsugi 243, Japan, pp. 167-170.
Kim, Byungwhan, et al., "Use of Neural Network to Control of Refractive Indexs of SiN Film Deposited by Plasma Enhanced Chemical Vapor Deposition", Plasma Chemistry and Plasma Processing, vol. 24, No. 1, Mar. 2004., pp. 29-40.

* cited by examiner

*Primary Examiner* — David Nhu
(74) *Attorney, Agent, or Firm* — Thomas R. FitzGerald, Esq.; Hiscock & Barclay, LLP

(57) ABSTRACT

A structure to diminish high voltage instability in a high voltage device when under stress includes an amorphous silicon layer over a field oxide on the high voltage device.

21 Claims, 5 Drawing Sheets

US 7,897,471 B2

METHOD AND APPARATUS TO IMPROVE THE RELIABILITY OF THE BREAKDOWN VOLTAGE IN HIGH VOLTAGE DEVICES

FIELD OF THE INVENTION

This invention relates to breakdown voltage in high voltage devices.

BACKGROUND OF THE INVENTION

Charges in the passivation layers and on the top passivation surface over a junction termination edge for high voltage power devices have been found to cause severe reliability failure (Hamza Yilmaz, "Optimization and Surface Charge Sensitivity of High Voltage Blocking Structures with Shallow Junction", IEEE Trans. Electron Devices, Vol 38, No. 7, P1666-1675, July 1991; John W. Osenbach and W. Knolle, "Semi-Insulating Silicon Nitride (SinSiN) as a Resistive Field Shield", IEEE Trans. Electron Devices, Vol. 37, No. 6, pp 1522-1528, June 1990; Jack Korec and Raban Held, "Comparison of DMSO/IGBT-Compatible High-Voltage Termination Structures and Passivation Techniques", IEEE Trans. Electron Devices, Vol. 40, No. 10, pp 1845-1554, October 1993). Semi-Insulating Silicon Nitride or Semi-Insulating Polycrystalline Silicon (SIPOS) has been used to reduce or shield the charges in high voltage power devices (Osenbach and Knolle, supra; T. Matsushita et al, "Highly Reliable High-Voltage Transistors by Use of SIPOS Process", IEEE Trans. Electron Devices, Vol ED-23, No. 8, pp 826-830, August 1976).

However, these methods still suffer from a number of problems. They couldn't screen all the charge effects on the Silicon due to their low conductivity. The devices are still failing or unstable after the high temperature and high voltage stress. For Semi-Insulating Silicon Nitride, although the film conductivity can be increased through lowering NH3/SiH4 ratio, the conductivity is limited in the range of $10^{-10}$ $(\Omega\text{-cm})^{-1}$ order (Osenbach and Knolle, supra), and the refractive index would be increased. Thus the stress for the film can also be increased (B. Kim et al., "Use of Neural Network to Control a Refractive Index of SiN Film Deposited by Plasma Enhanced Chemical Vapor Deposition", Plasma Chemistry and Plasma Processing, Vol 24, No. 1, March 2004) and more Si—H bonds can be produced. During high temperature reversed bias (HTRB) stress, some of the Si—H and N—H bonds in the film can be broken, and form the new charges and trapped centers. For SIPOS, some of the problems are the excessive leakage current and its extreme reactivity with humid environments (Osenbach and Knolle, supra). The breakdown voltage has been seriously degraded after HTRB stress.

Therefore, it can be appreciated that a new passivation method to improve the stability of the breakdown voltage would be highly desirable.

SUMMARY OF THE INVENTION

One embodiment of the present invention includes a method for improving the breakdown voltage stability in a high voltage device. The method comprises the steps of forming a field oxide on a junction termination at a top surface of a semiconductor layer, and forming an amorphous silicon layer on the field oxide layer above the junction termination.

Another embodiment of the present invention includes a method for improving the breakdown voltage stability in a termination region of a high voltage device. The method comprises the steps of forming a glass dielectric layer over a semiconductor layer of the high voltage device, forming an amorphous silicon layer over at least a portion of the glass dielectric layer, and forming a silicon nitride layer above the glass layer and the amorphous silicon layer.

The invention also comprises, in one form thereof, a semiconductor device including an epitaxial layer of a first conductivity type on a substrate, a region of a second conductivity type opposite to the first conductivity type in the epitaxial layer that forms a termination of a PN junction at a top surface of the epitaxial layer which is opposite a bottom surface of the epitaxial layer that is in contact with the substrate. The semiconductor device further comprises a field oxide layer on a portion of the top surface of the epitaxial layer which includes the termination of a PN junction, an amorphous silicon layer over the field oxide and the termination of a PN junction, and a silicon nitride layer over the amorphous silicon layer.

The invention also comprises, in another form thereof, a termination region in a high voltage device including a glass dielectric layer over a semiconductor layer of the high voltage device, an amorphous silicon layer over at least a portion of the glass dielectric layer, and a silicon nitride layer above the glass layer and the amorphous silicon layer.

BRIEF DESCRIPTION OF THE DRAWINGS

The features and advantages of this invention, and the manner of attaining them, will become apparent and be better understood by reference to the following description of the various embodiments of the invention in conjunction with the accompanying drawings, wherein.

Figure 1:
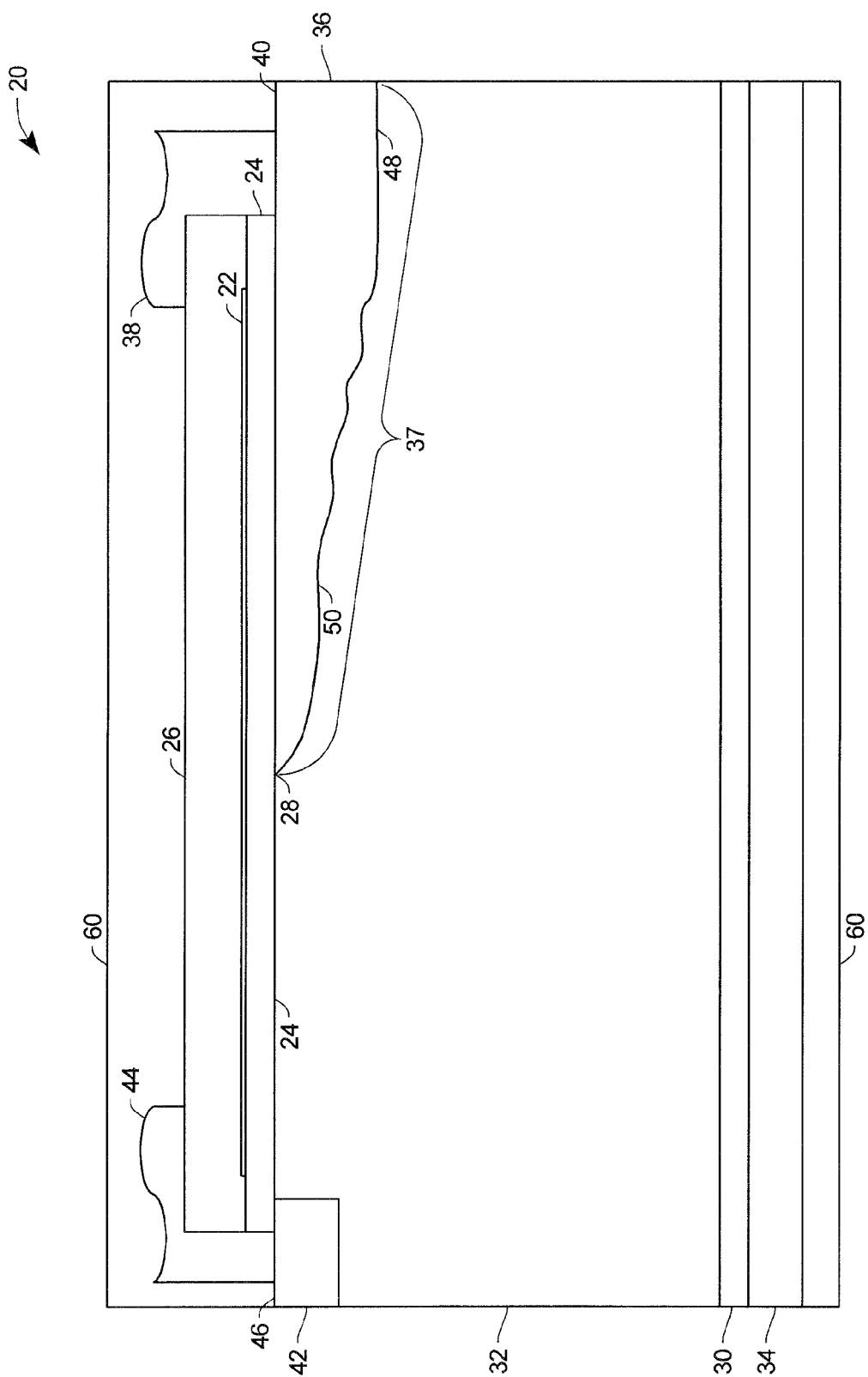
FIG. 1 is a diagrammatical side view of a high voltage diode with a structure to diminish high voltage instability in the diode when under stress according to an embodiment of the present invention.

It will be appreciated that for purposes of clarity, and where deemed appropriate, reference numerals have been repeated in the figures to indicate corresponding features. Also, the relative size of various objects in the drawings has in some cases been distorted to more clearly show the invention. The examples set out herein illustrate several embodiments of the invention but should not be construed as limiting the scope of the invention in any manner.

DETAILED DESCRIPTION

Shown in FIG. 1 is a diagrammatical side view of a high voltage (>500 volts) diode 20 which includes an amorphous silicon (a-Si) layer 22 between a field thermal oxide layer 24 and a silicon nitride layer 26 over a junction termination edge 28. The diode 20 includes a substrate 30 with an epitaxial layer 32 grown thereon. The substrate 30 and epitaxial layer 32 are of a first conductivity type, which in the embodiment shown in FIG. 1 is N type. However, the present invention is applicable to P type substrates and epitaxial layers. The diode 20 may have a back metal 34 which is in contact with the bottom surface of the substrate 30.

Formed in the epitaxial layer 32, which is lightly doped, is a P conductivity type anode 36. The anode 36 has a contact metal 38 formed thereon at a contact opening 40 in the silicon nitride layer 26. Also formed in the epitaxial layer 32 is an N conductivity type cathode 42. The cathode 42 has a contact metal 44 formed thereon at a contact opening 46 in the silicon nitride layer 26. The cathode 42 is heavily doped N type, while the anode 36 is heavily doped P type in the region 48 of the contact opening 40, but the doping level decreases in a lateral extension 50 of the anode 36, with the boundary between the anode 36 and the epitaxial layer 32 forming a PN junction 37.

Also shown in FIG. 1 is mold compound 60. The mold compound 60 is not shown in the other drawings to keep from cluttering the drawings and to emphasize the current invention.

The presence of the amorphous silicon layer 22, which has a much lower resistivity than the silicon nitride layer 26, in the range of 10-50 $\Omega$-cm, (silicon nitride has a resistivity of about $10^{10}$ $\Omega$-cm at room temperature) shields the majority of the charge in the mold compound and the silicon nitride from the epitaxial layer 32 by an equal and opposite amount of charge distributed throughout the amorphous silicon layer. The charge density is highest near the top surface of the amorphous silicon and lowest at the amorphous silicon and field oxide interface. Due to very high conductivity, the amorphous silicon layer restricts the electric field line that penetrates into the silicon nitride layer when the fringing field is applied.

Test devices with three different types of junction termination layers were built, and their breakdown voltage was measured before and after HTRB conditions were placed on the devices. The three device types were silicon nitride over field oxide, silicon nitride over BPSG over field oxide, and silicon nitride over amorphous silicon over field oxide. The first two types had significant degradation of their breakdown voltages, but the third type with the amorphous silicon layer had only a minor degradation of its breakdown voltage.

The device shown in FIG. 1, which does not have the sidewalls shown in FIGS. 3A-3C and 4A-4D, may optionally use silicon nitride with a normal refractive index, in the range of 1.9 to 2.2.

Figure 2A:
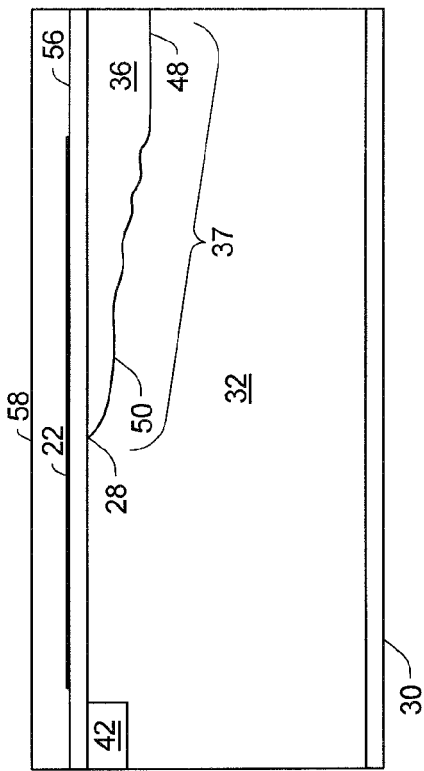
FIGS. 2A, 2B, 2C, and 2D are diagrammatical views of selected stages in an embodiment of a process for forming the diode shown in FIG. 1.

FIGS. 2A-2D show processing stages in forming the diode 20 according to one embodiment of the present invention. In FIG. 2A the lightly doped epitaxial layer 32 has been grown on the substrate 30. In one embodiment of the invention the epitaxial layer 32 has a resistivity of about 170 $\Omega$-cm, and the substrate 30 is from an N type FZ (<100>) wafer. The doped region 30 of the opposite conductivity type than the epitaxial layer 32 has been formed along with a heavily doped contact doped region 42. The PN junction 37 is designed to have a breakdown voltage of 3000V in an embodiment of the invention. A field oxide layer 56 with low charge has been formed on the epitaxial layer 32. The field oxide 56 in one embodiment of the invention is formed by steam growth to a thickness of about 0.75 $\mu$m with a post oxidation anneal to complete an non-bridge bonds and minimize the trap charge. As a result the total oxide charge is about $1.0 \times 10^{11}/cm^2$ to $1.5 \times 10^{11}/cm^2$. Amorphous silicon is then deposited on the field oxide layer 56 and patterned to form the amorphous silicon layer 22. In one embodiment of the invention the amorphous silicon is deposited at room temperature using a CHA e-beam Evaporator in an ultra-high vacuum (approximately $5 \times 10^{-6}$ to $1.0 \times 10^{-7}$) to a thickness of 0.01 to 0.05 $\mu$m. In this embodiment the amorphous silicon is undoped and has a resistivity of 10 $\Omega$-cm to 50 $\Omega$-cm. In an alternative embodiment the thickness of the amorphous silicon is in the range of 0.01 to 0.20 $\mu$m. The amorphous silicon layer is inherently more flexible than crystalline or polycrystalline materials and is radiation resistant. J. Kuendig et al, "Thin-Film Silicon Solar Cell for Space Application: Radiation Hardness and Application for an Integrated Solant Module", 28$^{th}$ IEEE PVSC, Anchorage, Ala., 2000 indicates, and U.S. Pat. No. 4,776,896 states, that the amorphous silicon has good adhesion to the field oxide layer 56.

Figure 2B:
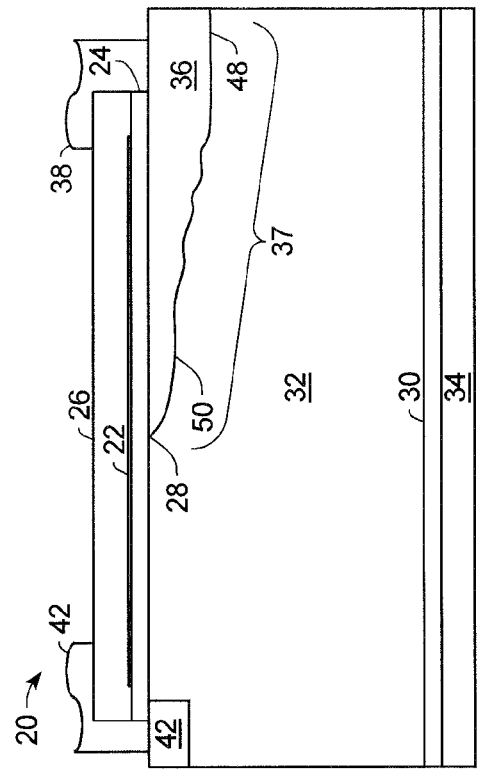
Figure 2C:
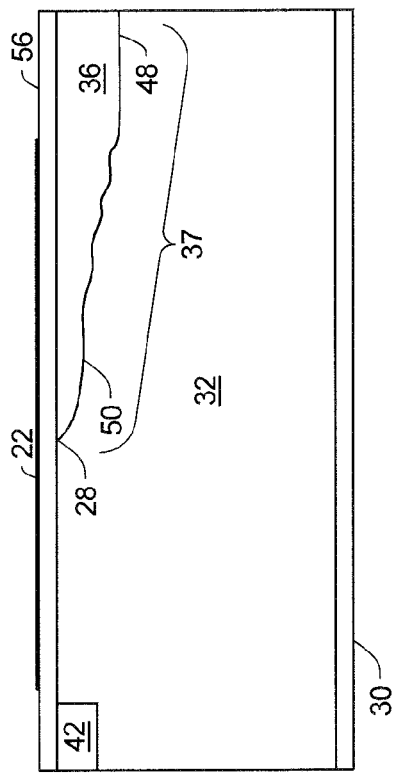
Figure 2D:
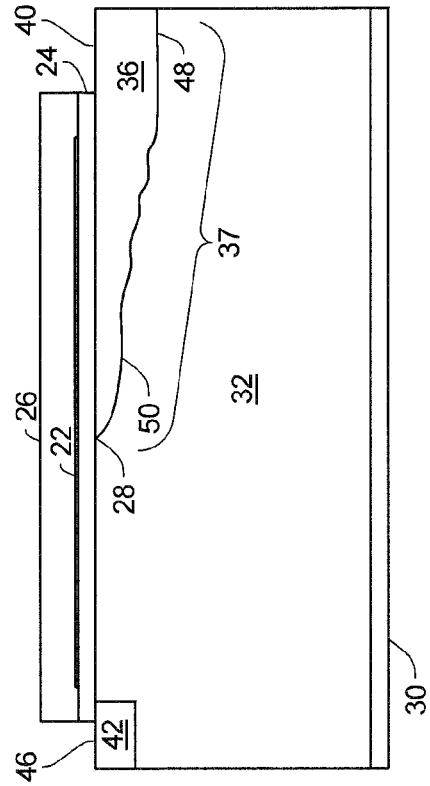

A silicon nitride layer 58 is deposited on the amorphous silicon layer and the exposed field oxide 56 as shown in FIG. 2B. The silicon nitride, in one embodiment of the invention, is deposited using a Novellus Plasma-enhanced chemical vapor deposition (PECVD) machine. In this embodiment the silicon nitride layer is 1.1 $\mu$m to 2.3 $\mu$m and has a refractive index of about 2.2 to 2.3. The field oxide layer 56 and the silicon nitride layer 58 are then patterned to form openings 40 and 46 to the doped regions 36 and 42, respectively, as shown in FIG. 2C. Metallization is then deposited and patterned to form the diode metal contacts 42 and 38 to the doped regions 42 and 36, respectively, as shown in FIG. 2D.

Figure 3A:
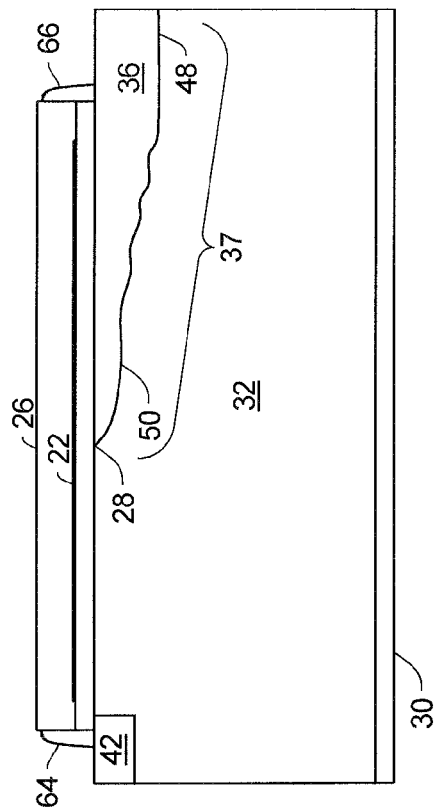
FIGS. 3A, 3B, and 3C are diagrammatical views of selected stages in an embodiment of a process for forming an alternative embodiment of the diode shown in FIG. 1.
Figure 3B:
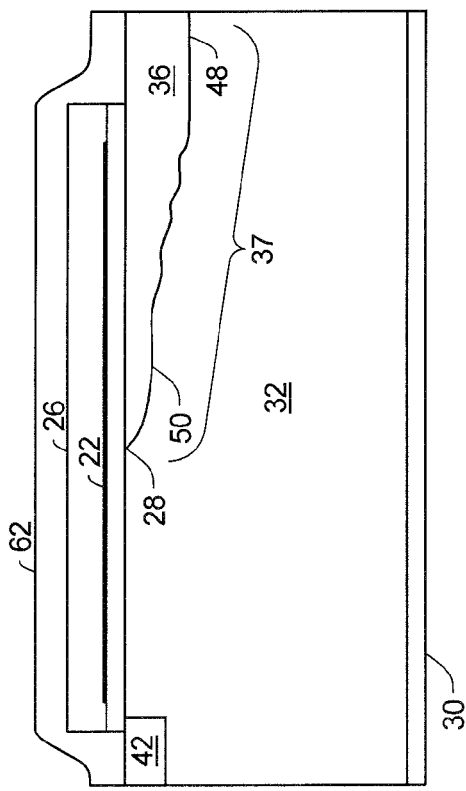
Figure 3C:
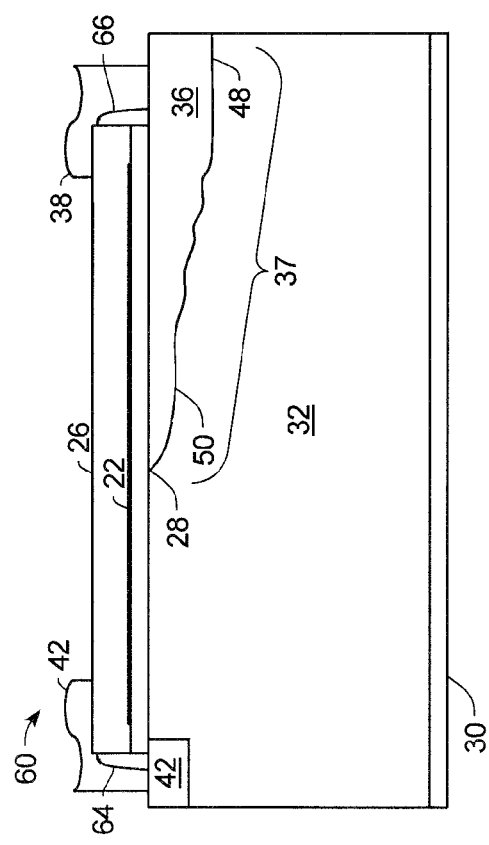

FIGS. 3A-3C show processing stages in forming a diode 60 according to another embodiment of the present invention. After the structure shown in FIG. 2C is formed, a low temperature oxide (LTO) 62 is deposited on the silicon nitride layer and the exposed portion of the epitaxial layer 32 as shown in FIG. 3A. An anisotropic etch is then made to the LTO layer 62 to form LTO sidewalls 64 and 66 over the doped regions 42 and 36, respectively, as shown in FIG. 3B. The LTO sidewalls 54 and 66 provide additional isolation of the amorphous silicon layer 22 from the contacts 42 and 38 shown in FIG. 3C.

Figure 4A:
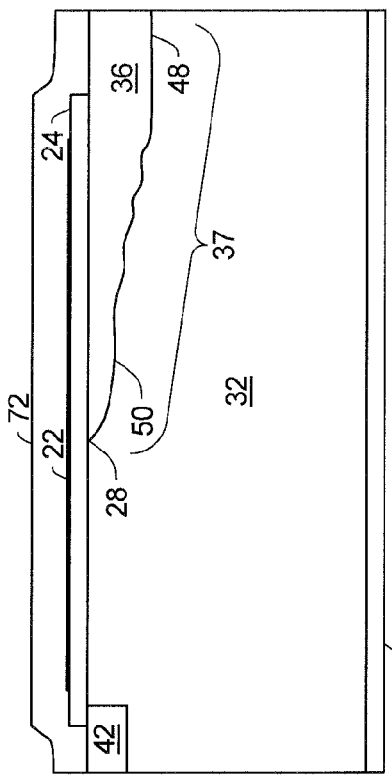
FIGS. 4A, 4B, 4C, and 4D are diagrammatical views of selected stages in an embodiment of a process for forming another alternative embodiment of the diode shown in FIG. 1.
Figure 4C:
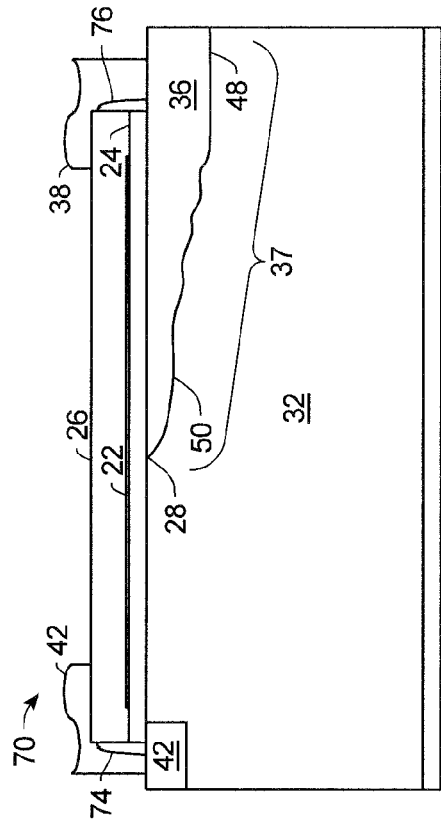
Figure 4B:
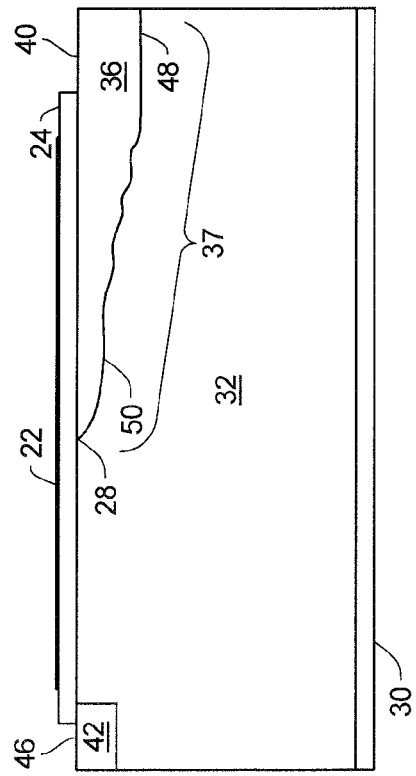
Figure 4D:
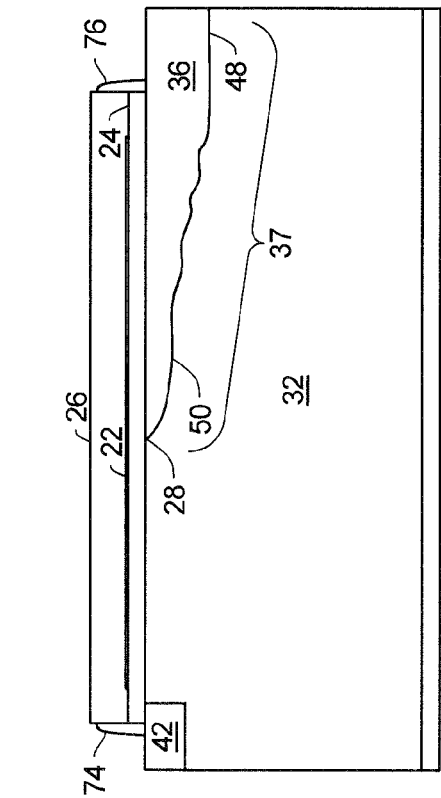

FIGS. 4A-4D show processing stages in forming a diode 70 according to yet another embodiment of the present invention. After the structure shown in FIG. 2A is formed, the field oxide 56 is patterned and etched exposing the openings 46 and 40 as shown in FIG. 4A. A layer of silicon nitride 72 is deposited over the amorphous silicon layer 22, the exposed portion of the field oxide layer 24, and the openings 46 and 40 as shown in FIG. 4B. An anisotropic etch is then made to the silicon nitride layer 72 to form silicon nitride sidewalls 74 and 76 over the doped regions 42 and 36, respectively, as shown in FIG. 4C. The silicon nitride sidewalls 74 and 76, like the LTO sidewalls 54 and 66, provide additional isolation of the amorphous silicon layer 22 from the contacts 42 and 38 shown in FIG. 4D.

Figure 5:
FIG. 5 is a diagrammatical view of still another alternative embodiment of the diode shown in FIG. 1.

FIG. 5 is a diagrammatical side view of FIG. 2A with the addition of an optional very thin layer 78 (about 0.05 to 0.2 $\mu$m) deposited on the amorphous silicon layer 22 before the openings 46 and 40 are exposed. The additional layer 78 may be a LTO layer, a rapid thermal oxidation (RTO) layer, or a plasma-assisted chemical vapor deposited silicon dioxide (POX) layer. This additional oxide layer 78 provides protection of the amorphous silicon layer 22 and good adhesion to the amorphous silicon layer 22 and the silicon nitride layer 26.

Figure 6:
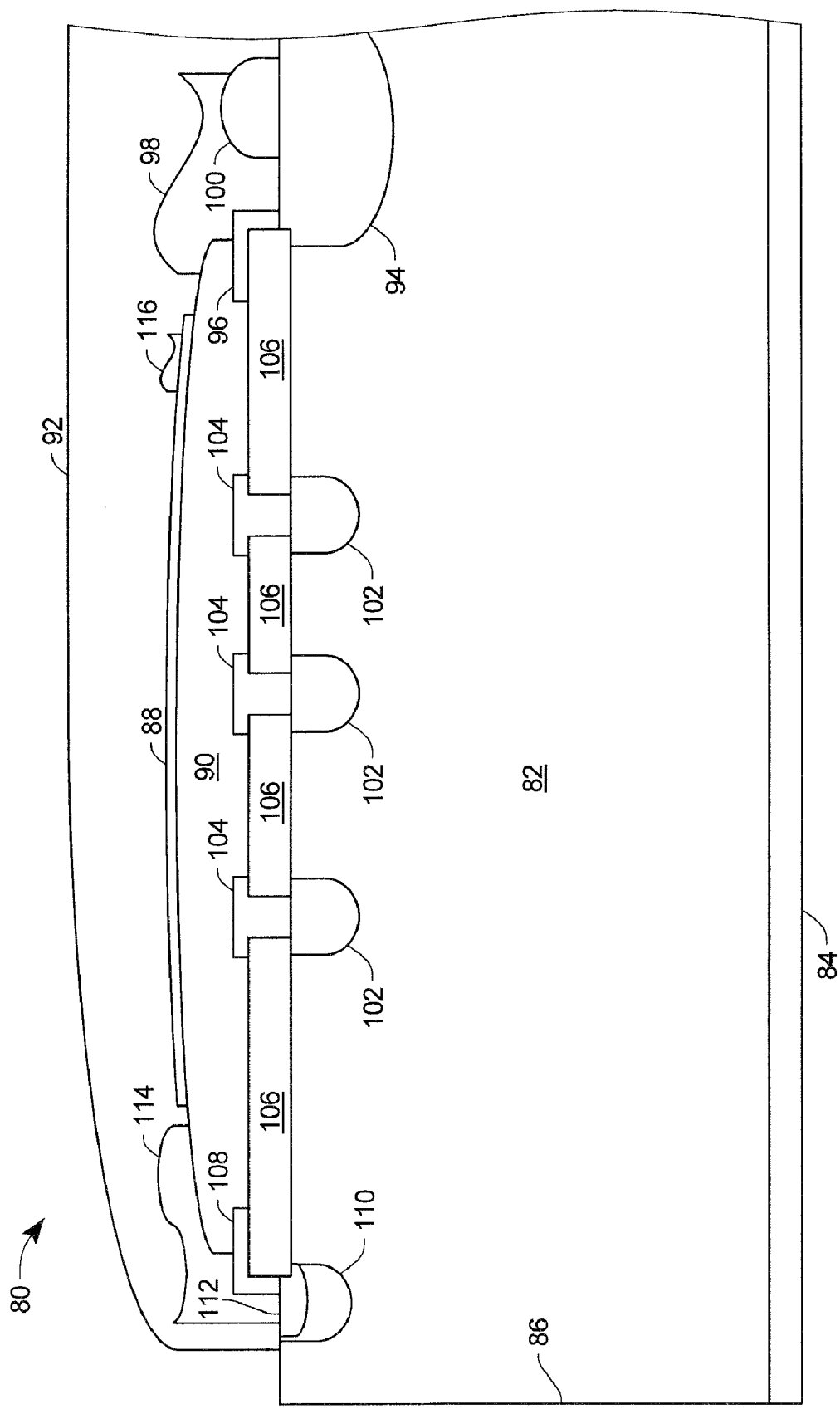
FIG. 6 is a diagrammatical view of a termination region in a high voltage device which includes a structure to diminish high voltage instability in the diode when under stress according to an embodiment of the present invention.

FIG. 6 is a diagrammatical side view of a floating ring termination region 80. The termination region 80 includes a lightly doped epitaxial layer 82, which may be either N type or P type, formed on a substrate 84. For ease of description the epitaxial layer 82 and the substrate 84 shown in FIG. 6 will be designated as N type. The edge 86 is the scribe line when the high voltage devices on a wafer are separated.

An amorphous silicon layer 88 lies on an interlevel dielectric layer 90, which may be phosphosilicate glass (PSG) or borophosphosilicate glass (BPSG). On the top surface of the amorphous silicon layer 88 is silicon nitride 92. In one embodiment of the present invention the amorphous silicon layer 88 is formed in the same manner as the amorphous silicon layer 22 shown in FIG. 1. A P well 94 which is at the edge of the active region, lies in the upper portion of the epitaxial layer 82, and connects to a polysilicon field plate 96 and to a metal contact 98. Another interlevel dielectric region 100, which may also be PSG or BPSG forms part of the boundary of the metal contact 98. Three isolated P− regions 102 formed in the upper portion of the epitaxial layer 82 are connect to isolated polysilicon regions 104 which extend partially over field oxide regions 106 which, in turn, separate the contacts to the P− regions 102 of the polysilicon regions 104 and the field plates 96 and 108. Another P− region 110 near the edge 86 has an N+ region 112 formed in its top portion which connects to another metal contact 114 and to a polysilicon field plate 108.

The amorphous silicon layer 88 may be floating or may be connected to ground by a metal connection 116.

While the invention has been described with reference to particular embodiments, it will be understood by those skilled in the art that various changes may be made and equivalents may be substituted for elements thereof without departing from the scope of the invention. In addition, many modifications may be made to adapt a particular situation or material to the teachings of the invention without departing from the scope of the invention.

Therefore, it is intended that the invention not be limited to the particular embodiments disclosed as the best mode contemplated for carrying out this invention, but that the invention will include all embodiments falling within the scope and spirit of the appended claims.

A3. The method of claim A2 wherein said silicon nitride layer has a refractive index in the range of about 2.2 to 2.3.

A13. A method of improving the breakdown voltage stability in a high voltage device comprising the steps of:

a) forming a field oxide on a junction termination at a top surface of a semiconductor layer;

b) forming an amorphous silicon layer on said field oxide layer above said junction termination wherein the boundaries of said amorphous silicon layer are formed such that said amorphous silicon layer is floating in said high voltage device;

c) forming contact openings in said field oxide, d) depositing silicon nitride onto said amorphous silicon and any exposed areas of said field oxide and said surface of a semiconductor layer; and e) anisotropically etching said silicon nitride to form sidewalls on a remaining portion of said silicon nitride and said field oxide.

A14. The method of claim A13 wherein said sidewalls are in contact with said amorphous silicon layer.

A15. The method of claim A13 wherein said amorphous silicon layer is formed at room temperature.

A16. The method of claim A13 wherein the thickness of said amorphous silicon layer is in the range of 0.01 to 0.05 μm.

A17. The method of claim A13 wherein the thickness of said amorphous silicon layer is in the range of 0.01 to 0.2 μm.

A18. A method of improving the breakdown voltage stability in a high voltage device comprising the steps of:

a) forming a field oxide on a junction termination at a top surface of a semiconductor layer;

b) forming an amorphous silicon layer on said field oxide layer above said junction termination wherein the boundaries of said amorphous silicon layer are formed such that said amorphous silicon layer is electrically floating;

c) forming a silicon nitride layer above said amorphous silicon layer.

d) depositing additional field oxide over said silicon nitride and any exposed areas of said amorphous silicon, said field oxide and said surface of a semiconductor layer; and e) anisotropically etching said deposited additional field oxide to form sidewalls on a remaining portion of said silicon nitride and said field oxide.

A19. The method of claim A18 wherein said sidewalls are in contact with said amorphous silicon layer.

A20. The method of claim A18 wherein said amorphous silicon layer is formed at room temperature.

A21. The method of claim A18 wherein the thickness of said amorphous silicon layer is in the range of 0.01 to 0.05 μm.

A22. The method of claim A18 wherein the thickness of said amorphous silicon layer is in the range of 0.01 to 0.2 μm.

A23. A method of improving the breakdown voltage stability in a termination region of a high voltage device comprising the steps of:

a) forming a glass dielectric layer over a semiconductor layer of said high voltage device;

b) forming an amorphous silicon layer over at least a portion of said glass dielectric layer; and c) forming a silicon nitride layer above said glass layer and said amorphous silicon layer.

A24. The method of claim A23 wherein the boundaries of said amorphous silicon layer are such that the amorphous silicon layer is electrically floating.

A25. The method of claim A23 wherein said amorphous silicon layer is grounded.

A26. The method of claim A23 wherein said amorphous silicon layer is formed at room temperature.

A27. The method of claim A23 wherein the thickness of said amorphous silicon layer is in the range of 0.01 to 0.05 μm.

A28. The method of claim A23 wherein the thickness of said amorphous silicon layer is in the range of 0.01 to 0.2 μm.

A30. The device of claim A29 wherein said silicon nitride layer has a refractive index in the range of about 2.2 to 2.3.

A39. A semiconductor device comprising:

a) an epitaxial layer of a first conductivity type on a substrate;

b) a region of a second conductivity type opposite to said first conductivity type in said epitaxial layer that forms a termination of a PN junction at a top surface of said epitaxial layer which is opposite a bottom surface of said epitaxial layer that is in contact with said substrate;

c) a field oxide layer on a portion of said top surface of said epitaxial layer which includes said termination of a PN junction;

d) a floating amorphous silicon layer over said field oxide and said termination of a PN junction;

e) a silicon nitride layer over said amorphous silicon layer said silicon nitride layer having a refractive index in the range of about 2.2 to 2.3; and f) contact openings in said field oxide layer and said silicon nitride layer and not in said amorphous silicon layer.

A40. The device of claim A39 wherein said silicon nitride layer and said field oxide layer have silicon nitride sidewalls adjacent said contact openings.

A41. The device of claim A40 wherein said silicon nitride sidewalls are in contact with said amorphous silicon layer.

A42. The device of claim A39 wherein said silicon nitride layer and said field oxide layer have field oxide sidewalls adjacent said contact openings.

A43. The device of claim A42 wherein said field oxide sidewalls are in contact with said amorphous silicon layer.

A44. The device of claim A39 wherein the thickness of said amorphous silicon layer is in the range of 0.01 to 0.05 μm.

A45. The device of claim A39 wherein the thickness of said amorphous silicon layer is in the range of 0.01 to 0.2 μm.

A46. A termination region in a high voltage device comprising:
 a) a glass dielectric layer over a semiconductor layer of said high voltage device;
 b) an amorphous silicon layer over at least a portion of said glass dielectric layer; and
 c) a silicon nitride layer above said glass layer and said amorphous silicon layer.

A47. The device of claim A46 wherein the boundaries of said amorphous silicon layer are such that the amorphous silicon layer is electrically floating.

A48. The device of claim A47 wherein said amorphous silicon layer is grounded.

A49. The device of claim A46 wherein the thickness of said amorphous silicon layer is in the range of 0.01 to 0.05 μm.

A50. The device of claim A46 wherein the thickness of said amorphous silicon layer is in the range of 0.01 to 0.2 μm.

The invention claimed is:

1. A semiconductor device comprising:
 an epitaxial layer of a first conductivity type on a substrate;
 a region of a second conductivity type opposite to said first conductivity type in said epitaxial layer that forms a termination of a PN junction at a top surface of said epitaxial layer which is opposite a bottom surface of said epitaxial layer that is in contact with said substrate;
 a field oxide layer on a portion of said top surface of said epitaxial layer which includes said termination of a PN junction;
 an amorphous silicon layer over said field oxide and said termination of a PN junction; and
 a silicon nitride layer over said amorphous silicon layer.

2. The semiconductor device of claim 1 wherein said amorphous silicon layer is electrically floating.

3. The semiconductor device of claim 1 further including contact openings in said field oxide layer, a contact to the region of second conductivity, and said silicon nitride layer and not in said amorphous silicon layer.

4. The semiconductor device of claim 3 wherein said silicon nitride layer and said field oxide layer have silicon nitride sidewalls adjacent said contact openings.

5. The semiconductor device of claim 4 wherein said silicon nitride sidewalls are in contact with said amorphous silicon layer.

6. The semiconductor device of claim 3 wherein said silicon nitride layer and said field oxide layer have field oxide sidewalls adjacent said contact openings.

7. The semiconductor device of claim 6 wherein said field oxide sidewalls are in contact with said amorphous silicon layer.

8. The semiconductor device of claim 1 wherein the thickness of said amorphous silicon layer is in the range of 0.01 to 0.05 μm.

9. The semiconductor device of claim 1 wherein the thickness of said amorphous silicon layer is in the range of 0.01 to 0.2 μm.

10. A semiconductor device comprising:
 an epitaxial layer of a first conductivity type on a substrate;
 a region of a second conductivity type opposite to said first conductivity type in said epitaxial layer that forms a termination of a PN junction at a top surface of said epitaxial layer which is opposite a bottom surface of said epitaxial layer that is in contact with said substrate;
 a first dielectric layer on a portion of said top surface of said epitaxial layer which includes said termination of a PN junction;
 an electrically floating charge shield layer over said first dielectric layer and said termination of a PN junction;
 a second dielectric layer over said charge shield layer; and
 a mold compound covering the second dielectric layer,
 wherein the charge shield layer shields the epitaxial layer from a majority of the charge in the mold compound and the second dielectric layer.

11. The semiconductor device of claim 10 wherein the charge shield layer is relatively highly conductive compared to the second dielectric layer.

12. The semiconductor device of claim 10 wherein the charge shield layer is relatively thin compared to the second dielectric layer.

13. The semiconductor device of claim 10 wherein the charge shield layer is amorphous silicon and the first dielectric layer is glass.

14. The semiconductor device of claim 13 wherein the glass comprises phosphosilicate (PSG) glass or brorophosphosilicate (BPSG) glass and the second dielectric layer is silicon nitride.

15. A semiconductor device comprising:
 an epitaxial layer of a first conductivity type on a substrate;
 a region of a second conductivity type opposite to said first conductivity type in said epitaxial layer that forms a termination of a PN junction at a top surface of said epitaxial layer which is opposite a bottom surface of said epitaxial layer that is in contact with said substrate;
 a field oxide layer on a portion of said top surface of said epitaxial layer which includes said termination of a PN junction;
 a floating amorphous silicon layer over said field oxide and said termination of a PN junction;
 a silicon nitride layer over said amorphous silicon layer said silicon nitride layer having a refractive index in the range of about 2.2 to 2.3; and
 contact openings in said field oxide layer and said silicon nitride layer and not in said amorphous silicon layer.

16. The semiconductor device of claim 15 wherein said silicon nitride layer and said field oxide layer have silicon nitride sidewalls adjacent said contact openings.

17. The semiconductor device of claim 16 wherein said silicon nitride sidewalls are in contact with said amorphous silicon layer.

18. The semiconductor device of claim 16 wherein said silicon nitride layer and said field oxide layer have field oxide sidewalls adjacent said contact openings.

19. The semiconductor device of claim 18 wherein said field oxide sidewalls are in contact with said amorphous silicon layer.

20. The semiconductor device of claim 15 wherein the thickness of said amorphous silicon layer is in the range of 0.01 to 0.05 μm.

21. The semiconductor device of claim 15 wherein the thickness of said amorphous silicon layer is in the range of 0.01 to 0.2 μm.

* * * * *